United States Patent [19]
Sabin

[11] Patent Number: 5,900,770
[45] Date of Patent: May 4, 1999

[54] VARIABLE LOADING APPARATUS FOR OUTPUT LOADING OF INTEGRATED CIRCUITS

[75] Inventor: Gregory D. Sabin, Phoenix, Ariz.

[73] Assignee: Intel Corporation, Santa Clara, Calif.

[21] Appl. No.: 08/874,496

[22] Filed: Jun. 13, 1997

[51] Int. Cl.$^6$ .............................. G01R 31/28; H01L 21/66
[52] U.S. Cl. ......................... 327/519; 327/518; 327/594; 326/62; 326/82; 326/86
[58] Field of Search ..................................... 327/530, 535, 327/538; 331/75; 365/189.01, 189.05

[56] References Cited

U.S. PATENT DOCUMENTS 5,162,757  11/1992  Williams et al. ........................ 331/75

FOREIGN PATENT DOCUMENTS 63-122973  5/1988  Japan .

Primary Examiner—Viet Q. Nguyen
Attorney, Agent, or Firm—Blakely, Sokoloff, Taylor & Zafman LLP

[57] ABSTRACT

A computer circuit comprising a driver circuit and a variable loading circuit coupled to the driver circuit. The variable loading circuit is configured to provide a first capacitive load to the output driver while operating according to a first state, and a second capacitive load while operating according to a second state. According to one embodiment, the variable loading circuit includes a first programmable cell element. The variable loading circuit is configured to operate according to the first state in response to the first programmable cell element being programmed. The variable loading circuit is further configured to operate according to the second state in response to the first programmable cell element being erased and a voltage potential being supplied.

19 Claims, 6 Drawing Sheets

VARIABLE LOADING APPARATUS FOR OUTPUT LOADING OF INTEGRATED CIRCUITS

FIELD OF THE INVENTION

The present invention relates generally to the field of integrated circuits, and more specifically to adding a variable capacitive load onto the output of integrated circuits.

BACKGROUND

Integrated circuits (ICs) are often required to drive a data bus quickly in order to meet various device and/or timing specifications. To meet these timing requirements, ICs are typically equipped with output drivers that have high signal switching strengths. FIG. 1 illustrates a computer circuit 10 that includes an output driver 20 and an input circuit 30. Output driver 20 may be a standard inverter stage that may be included within any type of IC driving device that transmits signals over a bus to any standard CMOS logic gate. Input circuit 30 may be a standard IC logic gate the presents a load capacitance ($C_L$) to output driver 20. The magnitude of $C_L$ is determined by the combined capacitance of the elements included within input circuit 30. The magnitude of $C_L$ determines the amount of current that is needed in order to quickly drive input circuit 30 to an appropriate logic level (i.e., logic 0 or 1). Input circuit 30 must be driven at a frequency that is sufficient to meet timing specifications for the IC. Timing specifications for a particular IC may be set by a manufacturer or an end user.

The larger the magnitude of $C_L$ presented to output driver 20, the larger the amount of current that is necessary to drive input circuit 30 quickly to an appropriate logic level. In cases where the magnitude of $C_L$ is large, output driver 20 requires transistors with a strong current drive strength. Conversely, the smaller the magnitude of $C_L$ presented to output driver 20, the smaller the amount of current that is necessary to quickly drive input circuit 30 to an appropriate logic level. Transistors with low drive strengths, therefore, may be used in output driver 20. Consequently, if the magnitude of $C_L$ is known at the time output driver 20 is designed, a circuit designer may design the drive strength accordingly.

A problem may occur, however, if the magnitude of $C_L$ from input circuit 30 is not known. This situation may occur under circumstances in which output driver 20 and input circuit 30 are coupled together in computer circuit 10 by a manufacturer (or end user) who designed only one or neither of the components. If the magnitude of $C_L$ is relatively high as compared to the drive strength of output driver 20, output driver 20 may not be capable of driving input circuit 30 fast enough to meet the timing requirements of computer circuit 10. Therefore, the performance of computer circuit 10 may be diminished if $C_L$ of input circuit 30 is too high with respect to the drive strength of output driver 20.

Alternatively, if $C_L$ is relatively low, computer circuit 10 will operate at a high frequency due to the high current generated by output driver 20. The high frequency is caused by the current generated from output driver 20 that is in excess of that needed to drive input circuit 30. If computer circuit 10 operates at a high frequency, a problem with signal noise may occur. Accordingly, the potential noise problems caused by operating at high frequencies could diminish the performance of computer circuit 10.

FIG. 2 illustrates a common method for reducing high frequency noise. A fixed decoupling capacitor C 40 is added to computer circuit 10 in order to provide an additional capacitive load (i.e., in addition to $C_L$). The additional capacitive load reduces the frequency of output driver 20 by storing excess charge in order to smooth out the noise of the signal. However, the addition of fixed capacitor 40 into an IC is not a very flexible approach.

Adding fixed capacitor 40 to computer circuit 10 after it has been constructed is generally cumbersome and impracticable. Also, in some circuits, $C_L$ is unknown making it difficult to accurately design fixed capacitor 40 for efficient system performance. For example, fixed capacitor 40 may provide an excessive load that will diminish circuit performance by slowing down the circuit in excess of what is needed. The designed capacitor may also be too small to provide an adequate load. In such a situation, either a second capacitor must be added, or the first capacitor must be removed and replaced with a larger capacitor. In either case, the proper decoupling capacitance that will maximize performance is likely to be found only through trial and error. Therefore, a flexible and efficient means for controlling the frequency between the interface of circuit elements is desired.

SUMMARY OF THE INVENTION

A computer circuit comprising a driver circuit and a variable loading circuit coupled to the driver circuit. The variable loading circuit is configured to provide a first capacitive load to the output driver while operating according to a first state, and a second capacitive load while operating according to a second state.

BRIEF DESCRIPTION OF THE DRAWINGS

The present invention is illustrated by way of example and not limitation in the figures of the accompanying drawings in which.

DETAILED DESCRIPTION

According to the present invention a computer circuit includes a variable loading circuit that provides a programmable capacitive load to reduce noise resulting from the computer circuit operating at a high frequency. In the initial operation of the computer circuit, programmable cell elements are deactivated such that no additional capacitive load is provided to the computer circuit. If it is subsequently necessary to reduce high frequency noise in the computer circuit, the programmable cell elements may be activated. The programmable cell elements, and transistors coupled to the programmable cell elements, provide a capacitive load to the computer circuit. After reviewing this specification, it will be apparent to those skilled in the art that the present invention may be practiced without some or all of the specific details disclosed herein. In other instances, well known circuit designs and techniques have not been described in detail in order not to unnecessarily obscure the present invention.

Figure 1:
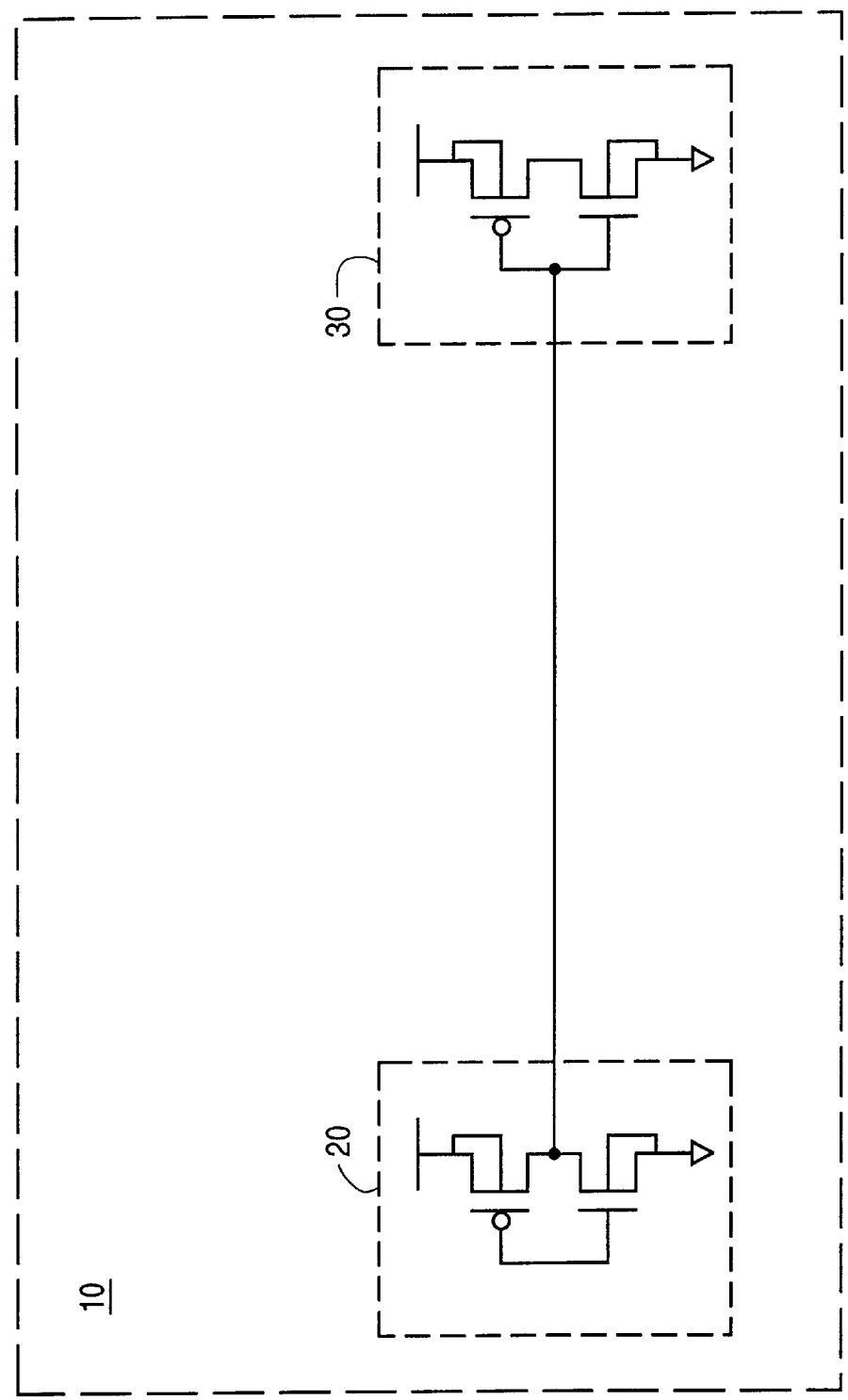
FIG. 1 illustrates a computer circuit according to the prior art.
Figure 2:
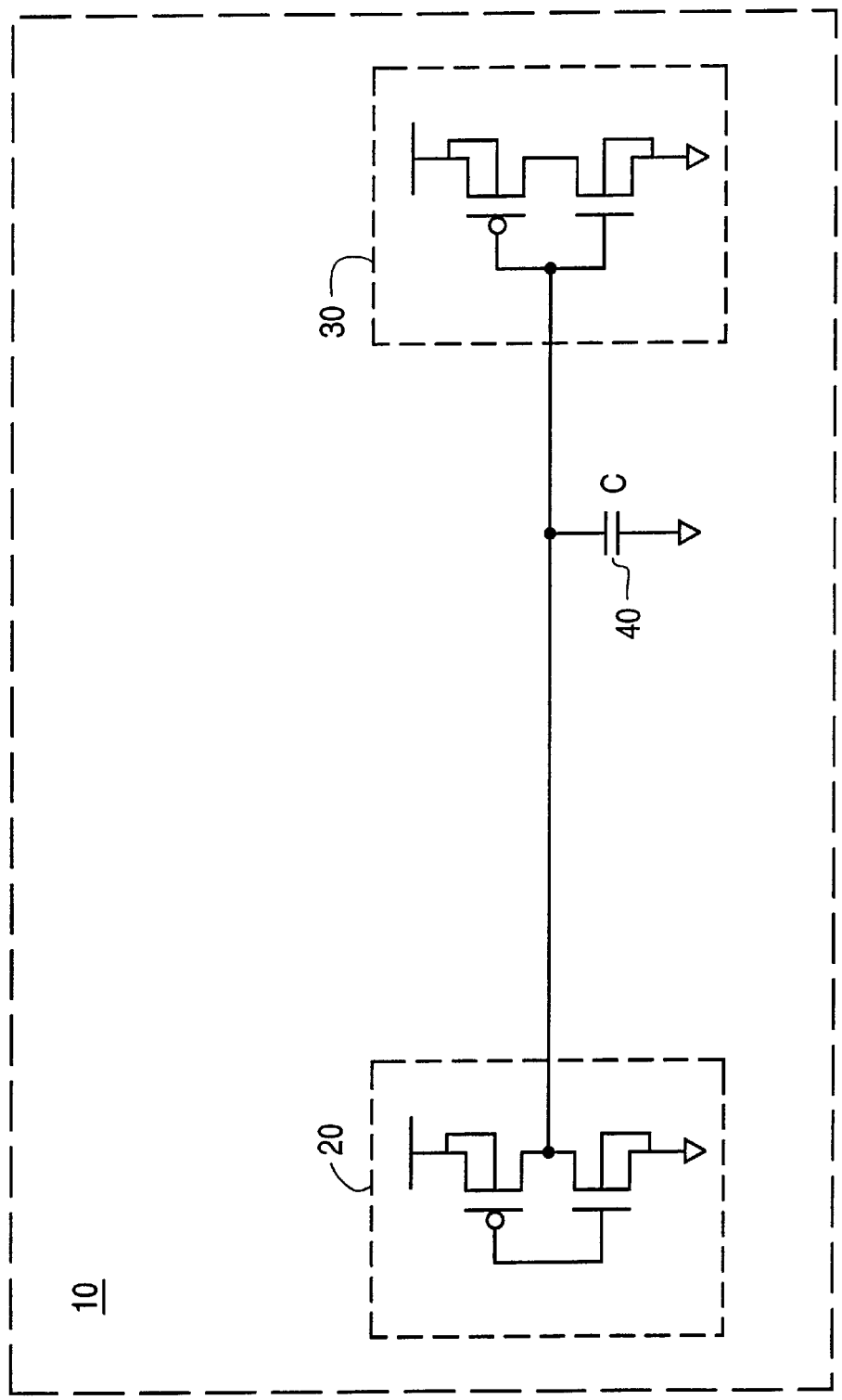
FIG. 2 illustrates a computer circuit according to the prior art.
Figure 3:
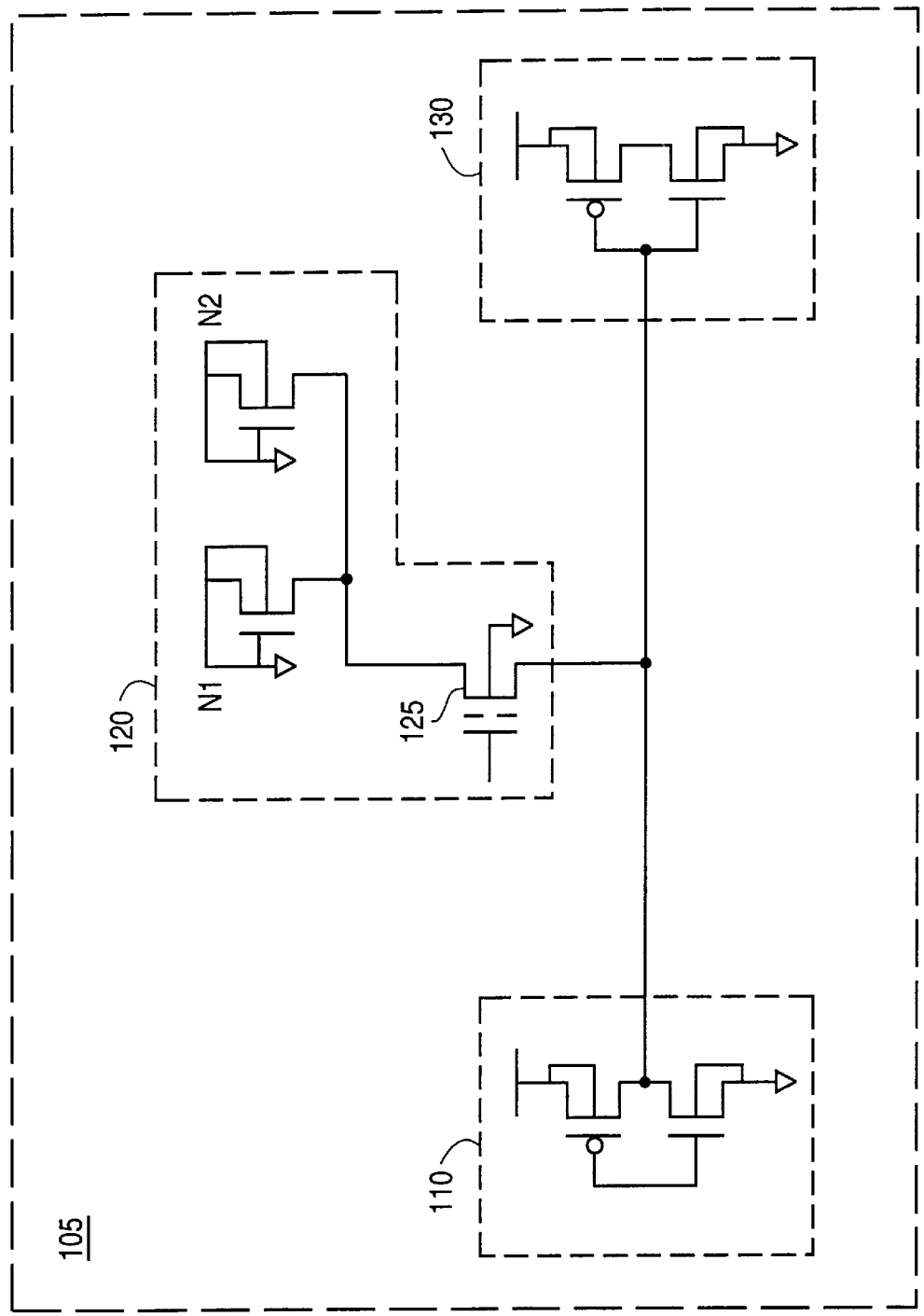
FIG. 3 illustrates a computer circuit according to one embodiment of the present invention.

FIG. 3 illustrates a computer circuit 105 according to one embodiment of the present invention. Computer circuit 105 includes an output driver 110, a variable loading circuit 120 connected to output driver 110, and an input circuit 130 connected to output driver 110 and variable loading circuit 120. Output driver 110 may be a standard inverter stage that is included within any type of integrated circuit driving device (e.g., a microprocessor, RAM, etc.) that transmits signals over a bus to any standard logic gate. Output driver 110 is configured to have a drive strength that is sufficient to drive input circuit 130 according to the timing specifications of computer circuit 105.

Input circuit 130 is illustrated as a CMOS inverter in this particular embodiment. However, in an alternate embodiment, input driver 130 may include any standard integrated circuit logic gate or element (e.g., an AND gate, OR gate, etc.). Input circuit 130 presents a load capacitance (C1) to output driver 110. The magnitude of C1 is determined by the combined capacitance of the elements included within input circuit 130.

Variable loading circuit 120 includes a programmable cell element 125, and two NMOS transistors (N1 and N2). Programmable cell element 125 has a source connected to output driver 110, and a drain connected to the drains of transistors N1 and N2. The source of each transistor is connected to its respective gate as well as to ground. The programmable cell element 125 presents a parasitic diffusion capacitance to output driver 110. Parasitic diffusion capacitance is caused by the drain diffusion to substrate capacitance of the chip. According to the present embodiment, programmable cell element 125 is a flash cell. However, in alternative embodiments, programmable cell element 125 may be a SPEED cell, fuse link or any other type of electrically erasable/programmable device.

Programmable cell element 125 may be in either a programmed or erased state. According to the present embodiment, programmable cell element 125 may be activated only while in an erased state. In order to activate programmable cell element 125, a positive voltage ($V_p$) must be applied to the gate of element 125 with respect to ground that exceeds a predetermined threshold voltage ($V_t$). If programmable cell element 125 is programmed, $V_t$ is higher than $V_p$. Consequently, programmable cell element 125 is not activated by $V_p$. Alternatively, if programmable cell element 125 is erased, $V_t$ is lower than $V_p$. Accordingly, programmable cell element 125 is activated. One of ordinary skill in the art will recognize that the operation of programmable cell element 125 may be reversed such that it may be activated while in a programmed state.

In the initial operation of computer circuit 105, a positive voltage ($V_p$) is applied to the gate of programmable cell element 125. Programmable cell element 125 is initially programmed, thus the threshold voltage ($V_t$) is higher than $V_p$. This causes programmable cell element 125 to remain in a deactivated state. Consequently, only a trivial additional capacitive load will be added to output driver 110 by variable loading circuit 120. The load capacitance C1 of input circuit 130 plus the parasitic diffusion capacitance of device 125 represents the entire capacitive load on output driver 110. Upon operating computer circuit 105, signal noise may be detected due to the circuit operating at a high frequency. The high frequency is caused by the current generated by output driver 120 that is in excess of that needed to drive input circuit 130. Computer circuit 105 may operate at high frequencies if C1 of input circuit 130 is too small to slow down output driver 120.

If signal noise is generated by high frequencies generated within computer circuit 105, the capacitive load on output driver 110 needs to be increased to slow down output driver 120. The capacitive load on output driver 110 may be increased by erasing programmable cell element 125. Programmable cell element 125 may be erased by any of the methods used in the art (e.g., ultraviolet light, high $V_p$ voltage, etc.). Once programmable cell element 125 is erased, $V_t$ becomes less than $V_p$, causing programmable cell element 125 to become activated. Accordingly, the connected programmable cell element drain, as well as transistors N1 and N2, will add a capacitive load C2 (i.e., $C2=C_{125}+C_{N1}+C_{N2}$) onto output driver 110. The activation of variable loading circuit 120 results in a capacitive load of C1+C2 on output driver 110.

Figure 4:
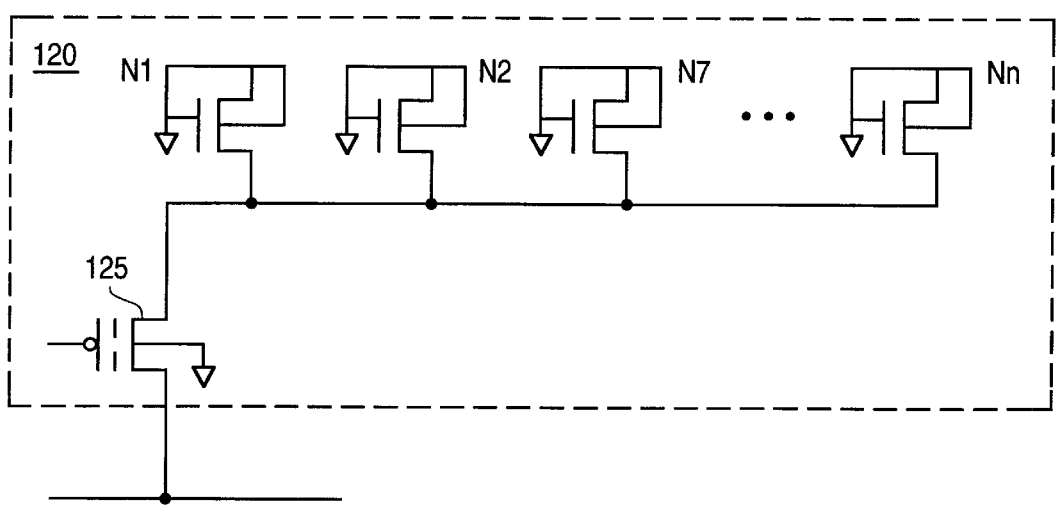
FIG. 4 illustrates an alternative embodiment of the variable loading circuit in accordance with another embodiment of the present invention.

FIG. 4 illustrates an alternative embodiment of variable loading circuit 120. In this embodiment, the drain of programmable cell element 125 is further connected to a third NMOS transistor N7, and additional transistors up through Nn. Transistor Nn represents an nth transistor connected to programmable cell element 125. This feature permits a designer to choose the number of transistors to be included in variable loading circuit 120. The operation of variable loading circuit 120 operates similarly to the embodiment described with respect to FIG. 3. However, each transistor added to variable loading circuit 120 increases the magnitude of C2. Furthermore, programmable cell element 125 includes an inverter. The inverter reverses the operation of programmable cell element 125 such that it may be activated while in the programmed state. Consequently, a capacitive load C1 is presented to output driver 110 when programmable cell element 125 is erased and a load C1+C2 is presented when programmable cell element 125 is programmed. One skilled in the art will recognize that the inverter is not required in this embodiment, but included only to illustrate an embodiment in which the functionality of programmable cell element 125 may be reversed (i.e., activated while in a programmed state).

Figure 5:
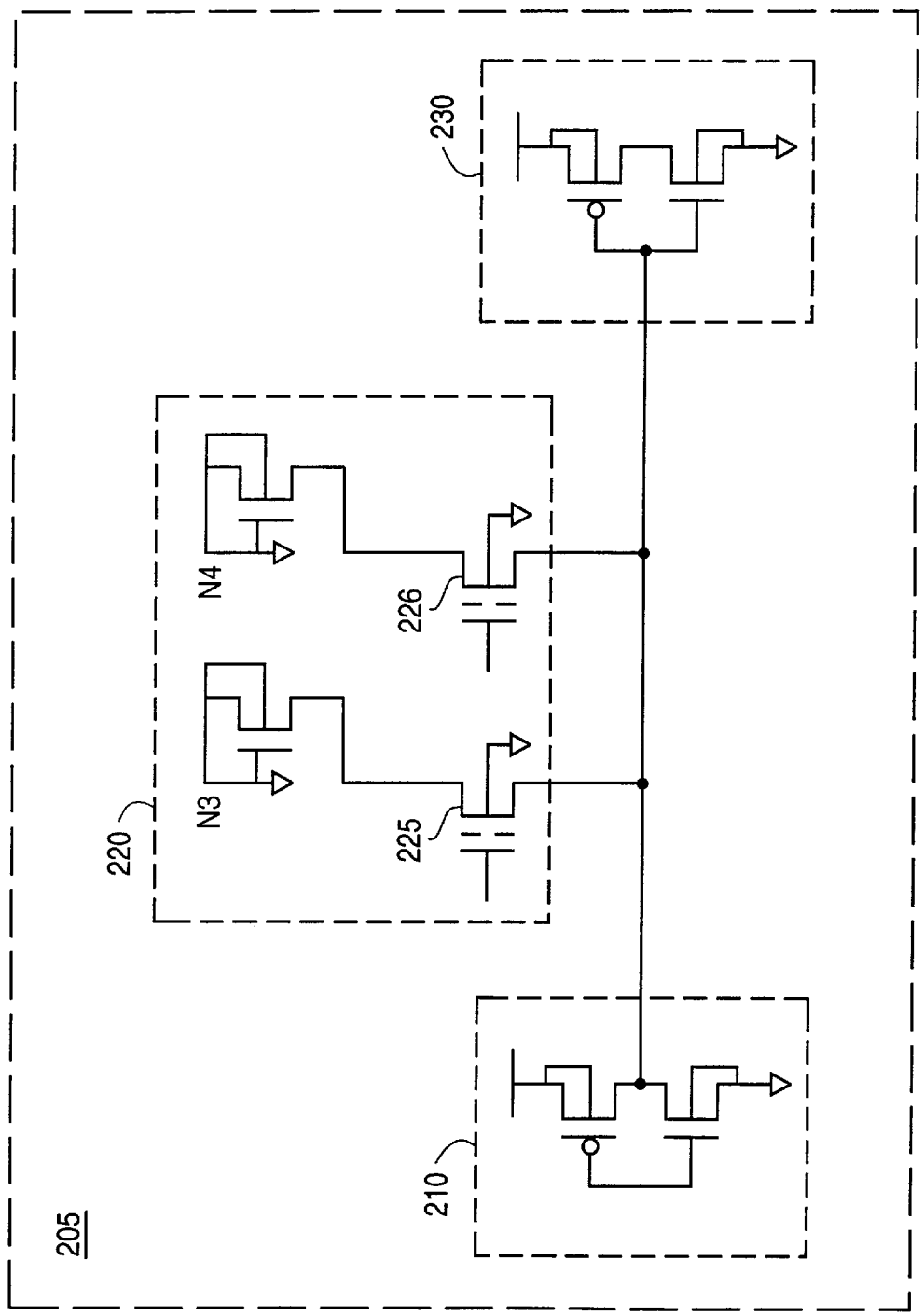
FIG. 5 illustrates an alternative embodiment of a computer circuit in accordance with an embodiment of the present invention.

FIG. 5 illustrates another embodiment of the present invention. Computer circuit 205 includes an output driver 210, a variable loading circuit 220 connected to output driver 210, and an input circuit 230 connected to output driver 210 and variable loading circuit 220. Output driver 210 is configured to have a drive strength that is sufficient to drive input circuit 230 according to the timing specifications of computer circuit 205. Input circuit 230 presents a load capacitance (C3) to output driver 210. The magnitude of C3 is determined by the combined capacitance of the elements included within input circuit 230.

Variable loading circuit 220 includes programmable cell element 225, programmable cell element 226, and two NMOS transistors (N3 and N4). Programmable cell element 225 has a source connected to output driver 210, and a drain connected to the drain of transistor N3. Programmable cell element 226 has a source connected to output driver 210, and a drain connected to the drain of transistor N4. The source of each transistor is connected to its respective gate as well as to ground. As described above, programmable cell elements 225 and 226 may be activated only while in an erased state. Further, $V_p$ must exceed $V_t$ in order to activate programmable cell elements 225 and 226 while they are erased. Alternatively, programmable cell elements 225 and 226 are not activated by $V_p$ when programmed.

In the initial operation of computer circuit 205, $V_p$ is applied to the gates of programmable cell elements 225 and 226. Initially both programmable cell elements 225 and 226 are programmed, causing each to remain in a deactivated state. Accordingly, no additional capacitive load will be added to output driver 210 by variable loading circuit 220. The load capacitance C3 of input circuit 230 plus the (normally trivial) parasitic diffusion capacitances of elements 225 and 226 represents the entire capacitive load on output driver 210. As described previously, high frequency signal noise may be detected while operating computer circuit 205. The high frequency is caused by excess current generated by output driver 220. Computer circuit 205 may operate at high frequencies if C3 of input circuit 230 is not sufficient to slow down output driver 220.

If high frequency noise is generated within computer circuit 205, the capacitive load on output driver 210 may be increased to slow down output driver 210. Thus, programmable cell element 225 may be erased to increase the capacitive load presented to output driver 210. As a result of being erased, programmable cell element 225 is activated. Consequently, the drain of programmable cell element 225 and transistor N3, will add a capacitive load C4 (i.e., C4=$C_{225}+C_{N3}$) onto output driver 210. Programmable cell element 226 continues to be in a deactivated state since it remains programmed. The activation of programmable cell element 225 results in a capacitive load of C3+C4 on output driver 210.

Upon further operation, signal noise may continue to be present in computer circuit 205. This situation may occur if the capacitive load of C3+C4 load is not sufficient to slow down the current drive generated by output driver 210. Thus, the capacitive load on output driver 210 may be further increased by erasing programmable cell element 226. This results in the activation of programmable cell element 226. Consequently, the drain of programmable cell element 226 and transistor N4 will add a capacitive load (C5) (i.e., C5=$C_{226}+C_{N4}$) onto output driver 210. The activation of programmable cell element 226 results in a capacitive load of C3+C4+C5 on output driver 210.

In the present embodiment, C4 and C5 are equal capacitive loads such that an equivalent capacitive load is added each time a programmable cell element is activated. Furthermore, the sequence of activating programmable cell elements 225 and 226 may be reversed such that programmable cell element 226 is activated first and programmable cell element 225 is activated last.

In an alternative embodiment, the respective capacitive loads of C4 and C5 may be unequal. The capacitive loads of C4 and C5 may be modified by varying either the size of the NMOS transistors or the size of the programmable cell elements. In addition, the capacitive loads of C4 and C5 may be varied by connecting additional transistors to programmable cell elements 225 and 226. In such an embodiment, one load (e.g., C4) may be initially added when a smaller capacitive load is needed, or a second load (e.g., C5) may be initially added if a larger capacitive load is needed.

For example, if computer circuit 205 is operating at an extremely high frequency, programmable cell element 226 may be erased. Programmable cell element 226 is activated, resulting in C5 being added onto output driver 210. Programmable cell element 226 is selected because its capacitive load is greater $V_p$ than that of programmable cell element 225. If, however, computer circuit 205 is operating marginally above the designed frequency, programmable cell element 225 may be erased. Programmable cell element 225 is subsequently activated by providing $V_p$. Consequently, C4 will be added onto output driver 210. Programmable cell element 225 is selected because its capacitive load is smaller than that of programmable cell element 226.

Figure 6:
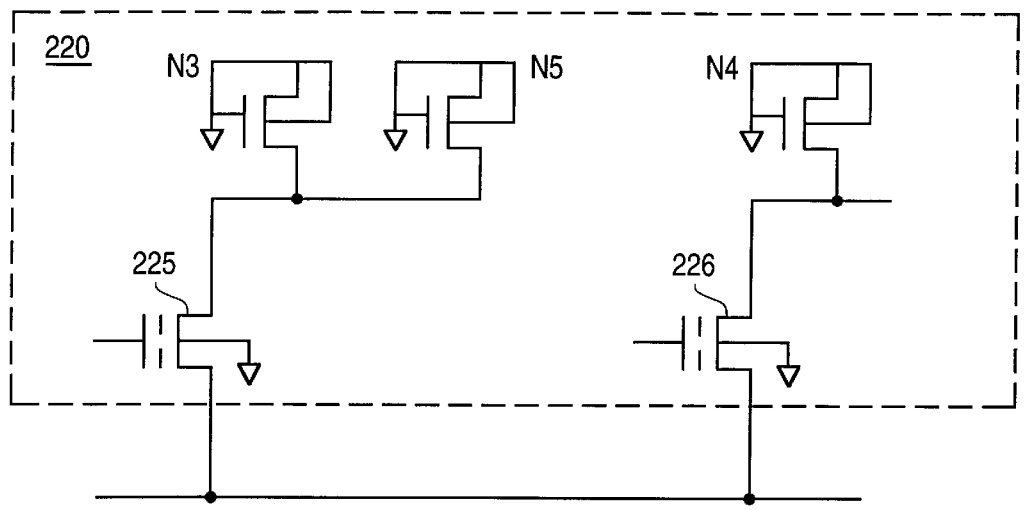
FIG. 6 illustrates an alternative embodiment of a variable loading circuit in accordance with a further embodiment of the present invention.

Referring to FIG. 6, an alternative embodiment of variable loading circuit 220 is illustrated. In this embodiment, the drain of programmable cell element 225 is connected to a second NMOS transistor N5. Programmable cell element 226 is connected to NMOS transistor N4. The source of each transistor is connected to its respective gate as well as to ground. The operation of variable loading circuit 220 is similar to the embodiment described with respect to FIG. 4. In this embodiment, however, the additional capacitance of transistor N5 is added to the capacitive load C4 (i.e., $C_{226}+C_{N3}+C_{N5}$) when programmable cell element 225 is activated.

Figure 7:
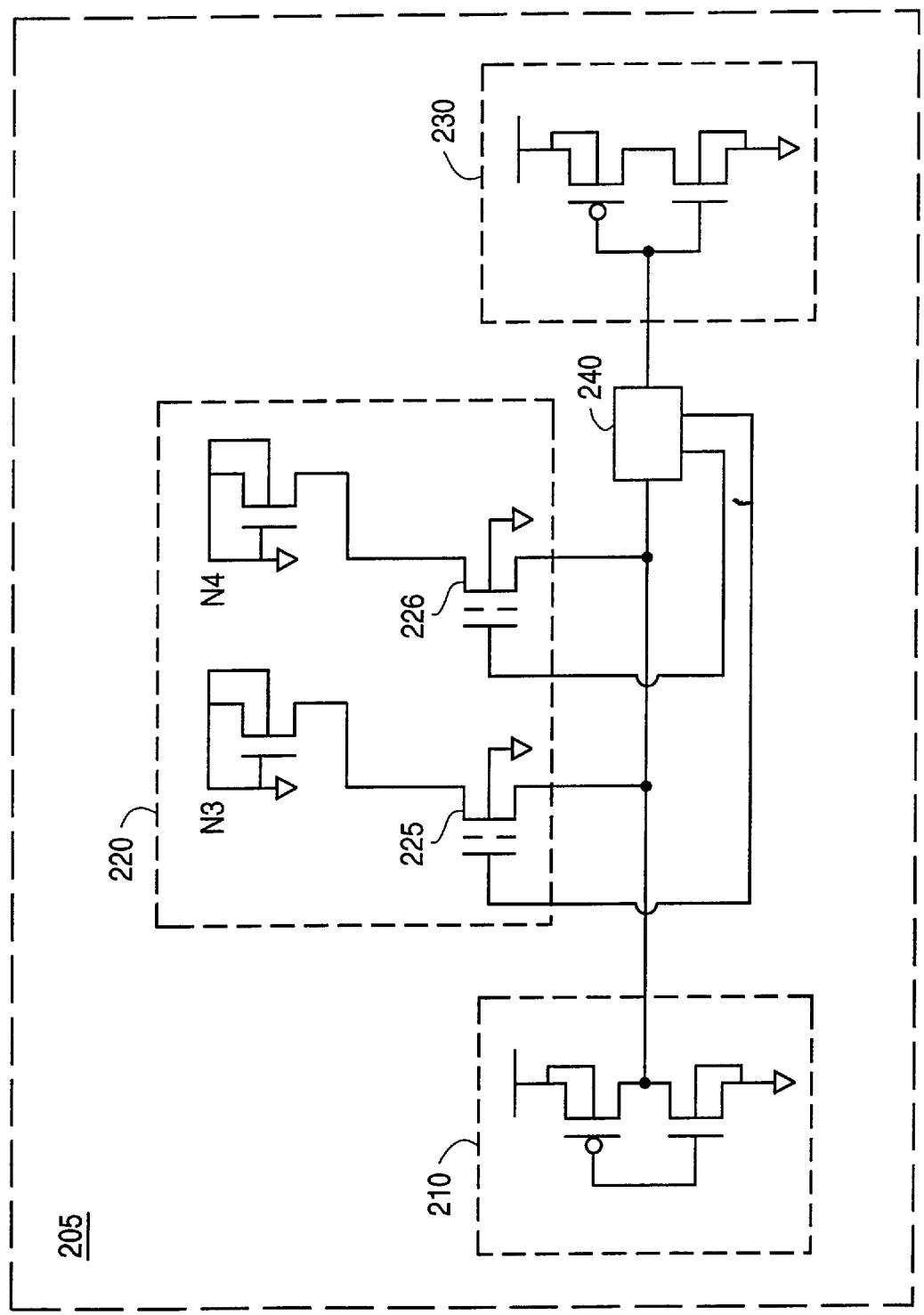
FIG. 7 illustrates an alternative embodiment of a computer circuit in accordance with a still further embodiment of the present invention.

FIG. 7 illustrates yet another embodiment of the present invention in which a feedback circuit 240 is added to computer circuit 205. Feedback circuit 240 is connected to output driver 210 and input circuit 230. In addition, feedback circuit 240 is connected to the gates of programmable cell elements 225 and 226. Feedback circuit 240 may be configured to sense the current being sourced to input circuit 230 as it is being driven by output driver 210. Alternatively, feedback unit 240 may sense the voltage at output driver 210.

In one embodiment, programmable cell elements 225 and 226 remain erased. Nevertheless, feedback circuit 240 controls the voltage supplied at the gates of programmable cell elements 225 and 226. Initially, no voltage is supplied to the gates of programmable cell elements 225 and 226 because they are in a deactivated state. Accordingly, no additional capacitive load will be added to output driver 210 by variable loading circuit 220.

The load capacitance C3 of input circuit 230 represents the entire nontrivial capacitive load on output driver 210. As output driver 210 drives input circuit 230, feedback circuit 240 measures the current being delivered to input circuit 230. If a predetermined threshold current sufficient to cause high frequency noise in computer circuit 205 is not exceeded, both programmable cell elements 225 and 226 remain deactivated. However, if feedback circuit 240 measures a current that is in excess of the predetermined threshold current, a positive voltage ($V_p$) is provided to programmable cell element 225 from feedback circuit 240. Once $V_p$ is applied, programmable cell element 225 is activated. The drain of programmable cell element 225 and transistor N3 will add a capacitive load (C4) onto output driver 210. The activation of programmable cell element 225 results in a capacitive load of C3+C4 on output driver 210.

Feedback circuit 240 continues to measure the current provided by output driver 210. If the current measured at feedback circuit 240 continues to exceed the threshold current, $V_p$ is provided to programmable cell element 226 from feedback circuit 240. Consequently, programmable cell element 226 is activated. The drain of programmable cell element 226 and transistor N4 will add a capacitive load (C5) onto output driver 210. The activation of programmable cell element 226 results in a capacitive load of C3+C4+C5 on output driver 210.

In an alternative embodiment, the respective capacitive loads of C4 and C5 may be unequal. As described above, capacitive loads of C4 and C5 may be modified by varying the size of the NMOS transistors, the size of the programmable cell elements, or by connecting additional transistors to programmable cell elements 225 and 226. In such an embodiment, one load (e.g., C4) may be initially added when a smaller capacitive load is needed, or a second load (e.g., C5) may be initially added if a larger capacitive load is needed.

For example, if feedback circuit 240 measures a current that exceeds the predetermined threshold by a large quantity, $V_p$ is provided to programmable cell element 226 from feedback circuit 240. Programmable cell element 226 is activated, and C5 will be added onto output driver 210. Programmable cell element 226 is selected because its capacitive load is greater than that of programmable cell element 225. If, however, feedback circuit 240 measures a current that exceeds the predetermined threshold by a small quantity, $V_p$ is provided to programmable cell element 225 from feedback circuit 240. Programmable cell element 225 is activated, and C4 will be added onto output driver 210. Programmable cell element 225 is selected because its capacitive load is smaller than that of programmable cell element 226.

It is apparent that the present invention provides a flexible and efficient manner of providing a capacitive load to smooth out high frequency noise generated by a strong output driver. The present invention allows for programming of a capacitive load at any time in order to meet critical circuit needs. The present invention further provides that a more precise capacitive load may be added to the output driver when needed, without diminishing system performance. For example, after constructing computer circuit 205 (or 105) wherein the load capacitance of an input circuit is unknown, precise capacitive loads may be programmed into computer circuit 205 to reduce the frequency in order to eliminate noise. The present invention dispenses with the trial and error process of designing an exact decoupling capacitor to reduce high frequency noise.

Although the present invention has been described in terms of preferred embodiments, it will be appreciated that various modifications and alterations might be made by persons skilled in the art without departing from the spirit and scope of the invention. For example, embodiments may be added in which additional programmable cell elements may be included. Furthermore, additional NMOS transistors may be added to the programmable cell elements in order to provide a greater capacitive load to the computer circuit. Therefore, the foregoing discussion should be regarded as illustrative only and the invention measured only in terms of the claims which follow.

What is claimed is:

1. A computer circuit comprising:
   a driver circuit;
   a variable loading circuit coupled to the driver circuit, the variable loading circuit configured to provide a first capacitive load while operating according to a first state and a second capacitive load while operating according to a second state; and
   a first programmable cell element, wherein the first programmable cell element controls whether the variable loading circuit is operated in the first state or the second state, wherein the computer circuit operates at a normal operating frequency in the first state and the computer circuit operates at a first lower operating frequency in the second state.

2. The computer circuit of claim 1, wherein the variable loading circuit configured to operate according to the first state in response to the first programmable cell element being programmed and according to the second state in response to the first programmable cell element being erased.

3. The computer circuit of claim 2, wherein a first transistor is coupled to the first programmable cell element, the first transistor configured to be activated in response to the first programmable cell element being erased.

4. The computer circuit of claim 3, wherein a second transistor is coupled to the first programmable cell element, the second transistor configured to be activated in response to the first programmable cell element being erased.

5. The computer circuit of claim 4, wherein the variable loading circuit further comprises a second programmable cell element, the variable loading circuit configured to operate according to the first state in response to the first and second programmable cell elements being programmed and according to a third state in response to the first and second programmable cell elements being erased, wherein the computer circuit operates at a second lower operating frequency in the third state, the second lower operating frequency being lower than the first lower operating frequency.

6. The computer circuit of claim 5, wherein a third transistor and a fourth transistor are coupled to the second programmable cell element, the third and fourth transistors configured to be activated in response to the second programmable cell element being erased.

7. The computer circuit of claim 6 further comprising a feedback circuit coupled to the first and second programmable cell elements, the feedback circuit configured to transmit a signal to the first and second programmable cell elements in response to detecting an excess current in the computer circuit.

8. The computer circuit of claim 1, wherein the variable loading circuit is configured to operate according to the first state in response to the first programmable cell element being erased and according to the second state in response to the first programmable cell element being programmed.

9. The computer circuit of claim 8, wherein the variable loading circuit further comprises a second programmable cell element, the variable loading circuit configured to operate according to the first state in response to the first and second programmable cell elements being erased and according to a third state in response to the first and second programmable cell elements being programmed, wherein the computer circuit operates at a second lower operating frequency in the third state, the second lower operating frequency being lower than the first lower operating frequency.

10. The computer circuit of claim 1, wherein the variable loading circuit further comprises a plurality of programmable cell elements, each of said plurality of programmable cell elements having at least one transistor coupled thereto.

11. A variable loading circuit for decreasing an operating frequency of a computer circuit comprising:
    a first transistor; and
    a first programmable cell element coupled to the first transistor, the variable loading circuit having a first capacitive load while the first programmable cell element is programmed and a second capacitive load while the first programmable cell element is erased;
    the computer circuit operating at a normal operating frequency with the first capacitive load and the computer circuit operating at a first lower operating frequency with the second capacitive load.

12. The variable loading circuit of claim 11, wherein the first transistor is configured to be activated in response to the first programmable cell element being erased.

13. The variable loading circuit of claim 12, wherein a second transistor is coupled to the first programmable cell element, the second transistor configured to be activated in response to the first programmable cell element being erased.

14. The variable loading circuit of claim 13, further comprising:

third transistor;

a fourth transistor; and a second programmable cell element coupled to the third and fourth transistors, the variable loading circuit having the first capacitive load while the first and the second programmable cell elements are programmed and a third capacitive load while the first and second programmable cell elements are erased, wherein the computer circuit operates at a second lower operating frequency with the third capacitive load, the second lower operating frequency being lower than the first lower operating frequency.

15. The variable loading circuit of claim 14, wherein the second programmable cell element is configured to activate the third and fourth transistors in response to the second programmable cell element being erased.

16. In a computer circuit comprising an output driver and a loading circuit, the loading circuit including a programmable cell element, a method of providing a variable capacitive load to the output driver, comprising the steps of:

programming the programmable cell element, wherein a first capacitive load that operates the circuit at a normal operating frequency is provided to the output driver; and erasing the programmable cell element, wherein a second capacitive load that operates the circuit at a lower operating frequency is provided to the output driver in response to the programmable cell element being erased.

17. In a computer circuit comprising an output driver and a loading circuit, the loading circuit including a programmable cell element, a method of providing a variable capacitive load to the output driver, comprising the steps of:

erasing the programmable cell element, wherein a first capacitive load that operates the circuit at a normal operating frequency is provided to the output driver; and programming the programmable cell element, wherein a second capacitive load that operates the circuit at a lower operating frequency is provided to the output driver in response to the programmable cell element being programmed.

18. In a computer circuit comprising an output driver and a loading circuit, the loading circuit including a first programmable cell element and a second programmable cell element, a method of providing a variable capacitive load to the output driver, comprising the steps of:

programming the first programmable cell element;

programming the second programmable cell element, wherein a first capacitive load that operates the computer circuit at a normal operating frequency is provided to the output driver in response to the first and second programmable cell elements being programmed;

erasing the first programmable cell element, wherein a second capacitive load that operates the circuit at a first lower operating frequency is provided to the output driver in response to the first programmable cell element erased; and erasing the second programmable cell element, wherein a third capacitive load that operates the circuit at a second lower operating frequency is provided to the output driver in response to the first and second programmable cell elements being erased the second lower operating frequency being lower than the first lower operating frequency.

19. In a computer circuit comprising an output driver and a loading circuit, the loading circuit including a first programmable cell element and a second programmable cell element, a method of providing a variable capacitive load to the output driver, comprising the steps of:

erasing the first programmable cell element and the second programmable cell element, wherein a first capacitive load that operates the computer circuit at a normal operating frequency is provided to the output driver in response to the first and second programmable cell elements being erased;

programming the first programmable cell element, wherein a second capacitive load that operates the circuit at a first lower operating frequency is provided to the output driver in response to the first programmable cell element being programmed; and programming the second programmable cell element, wherein a third capacitive load that operates the circuit at a second lower operating frequency is provided to the output driver in response to the first and second programmable cell elements being programmed the second lower operating frequency being lower than the first lower operating frequency.

* * * * *